United States Patent
Honda

(10) Patent No.: US 7,161,421 B2
(45) Date of Patent: Jan. 9, 2007

(54) VOLUME CONTROL IN CLASS D AMPLIFIER USING VARIABLE SUPPLY VOLTAGE

(75) Inventor: Jun Honda, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 61 days.

(21) Appl. No.: 11/013,990

(22) Filed: Dec. 16, 2004

(65) Prior Publication Data

US 2005/0127991 A1 Jun. 16, 2005

Related U.S. Application Data

(60) Provisional application No. 60/530,448, filed on Dec. 16, 2003.

(51) Int. Cl.
*H03F 3/38* (2006.01)

(52) U.S. Cl. ........................................................ 330/10

(58) Field of Classification Search .................. 330/10, 330/207 A, 251; 381/104, 107–108
See application file for complete search history.

(56) References Cited

U.S. PATENT DOCUMENTS 7,049,885 B1 * 5/2006 Ishizaki ....................... 330/10
2005/0162224 A1 * 7/2005 Kwong ......................... 330/51

* cited by examiner

*Primary Examiner*—Robert Pascal
*Assistant Examiner*—Hieu Nguyen
(74) *Attorney, Agent, or Firm*—Ostrolenk, Faber, Gerb & Soffen, LLP

(57) ABSTRACT

A Class D audio amplifier including a gain stabilization feedback loop in which volume control is achieved by varying the bus voltage. Changes in the bus voltage are compensated for by complementary changes in the gain of a compensation element in feedback loop so the signal level at the output of the Class D stage can be adjusted independent of the feedback. A digital attenuator can be employed ahead of the amplifier to shift the effective gain of the amplifier output to provide additional volume control range.

3 Claims, 3 Drawing Sheets

VOLUME CONTROL IN CLASS D AMPLIFIER USING VARIABLE SUPPLY VOLTAGE

CROSS REFERENCE TO RELATED APPLICATIONS

This application claims the benefit and priority of U.S. Provisional patent application Ser. No. 60/530,448 filed Dec. 16, 2003 entitled VOLUME CONTROL IN CLASS D AMPLIFIER USING VARIABLE SUPPLY VOLTAGE, the entire disclosure of which is incorporated herein by reference.

BACKGROUND OF THE INVENTION

1. Field of the Invention

This invention relates to Class D audio amplifiers, and more particularly to Class D audio amplifiers in which the volume control function is provided by varying the supply (bus) voltage for the Class D output stage.

2. Relevant Art

Class D amplifiers, also known as switching amplifiers, are characterized by an output stage in the form of a pair of transistors, typically MOSFETS, connected in series between positive and negative sides of the power supply, with the common node connected to drive a loudspeaker through a low-pass filter. In operation, the two output transistors function in a switching mode, i.e. they are alternately driven between substantially fully conductive and non-conductive states so that the voltage at the common output node is alternately switched between the positive and negative supply voltages.

Amplification of the audio signal is achieved by pulse width modulation (PWM) of the gate drive signals for the power transistors, and is recovered in amplified form by the low pass filter. To facilitate this, the switching frequency is selected to be very high compared to the audio signal (e.g., 250–300 KHz).

Because the output transistors are either substantially fully on or fully off except during the switching transitions, the Class D amplifier exhibits low power usage and high efficiency. With good circuit design, efficiency of 75% or even as high as 90% can readily be achieved. Moreover, modern Class D amplifiers exhibit excellent audio frequency response and low distortion values which are comparable to those of well designed audio amplifiers of other types. Class D amplifiers have been known for almost 50 years, but are finding increasing utility in applications where high heat dissipation (due to high current usage) must be avoided, such as flat panel televisions, and where battery life must be maximized for economy and user convenience, such as in cell phones and other portable audio equipment.

FIG. 1 shows a conventional Class D amplifier 10 having a half-bridge topology with two MOSFET output transistors 12 and 14 driving a loudspeaker 16 though an LC filter 18. The audio input signal is provided at 20, and along with a negative feedback signal from a feedback circuit 22, is coupled through an error amplifier 24 to one input of a comparator 26. The other input for comparator 26 is provided by a triangle wave generator 28 to provide a pulse width modulated input signal for a gate control circuit 30 which controls the operation of MOSFETS 12 and 14.

FIG. 2 shows the output stage of a Class D amplifier 40 in a full or H-bridge topology. Here, two MOSFET output transistor pairs 42a–42b and 44a–44b drive a loudspeaker 46 though respective LC filters 48a–48b. This provides added audio output power with the same power supply voltage, and also permits open loop operation, but obviously at the price of a more complex and costly circuit.

One of the issues in the design of a Class D amplifier is how to implement volume control. Conventionally, this is done by placing an attenuator ahead of the Class D amplifier stage as illustrated at 50 in FIG. 1. The overall gain is regulated by the feedback loop. Alternatively, or, since gain of the Class D stage itself is inherently proportional to its bus voltage, overall gain can be controlled by a regulated power supply.

The above described conventional approach is satisfactory, but because the gain of the Class D amplifier is inherently proportional to the bus voltage, it is also possible to control the output volume by varying the bus voltage. This has the advantage of reducing the bus voltage from that corresponding to maximum output, which can reduce noise generation both in and out of the audible frequency range, with consequent reduction of EMI and improved signal to noise ratio performance.

Unfortunately, there is a significant limitation to varying the bus voltage as a means of volume control. Class D amplifiers using half bridge topology are constructed as illustrated in FIG. 1 with the power transistors in a feedback loop, and, although a feedback loop is not essential in full bridge topology, it is often provided in such cases as well. The problem is illustrated in FIG. 3 which illustrates in functional form, an input error amplifier 52, the Class D stage 54 having a gain K, and a feedback circuit 56 having an effective gain $\beta$. With the Class D stage in a feedback loop, the audio frequency modulator will compensate the total gain of the amplifier to be constant even if the Class D stage gain K changes with changes in the bus voltage is changed. Thus, volume control by varying the bus voltage is not possible.

Thus, a need exists for a way to conveniently provide volume control for a Class D amplifier by varying the bus voltage to the output stage, irrespective of the topology.

SUMMARY OF THE INVENTION

The present invention seeks to meet this need by providing an implementation of variable bus voltage volume control for Class D amplifiers in which the power transistors are included in a gain stabilization feedback loop.

According to the invention, a volume control for a Class D amplifier is implemented in a circuit configuration including a variable bus voltage power supply coupled to a variable gain feedback circuit. The circuits are constructed and coupled in such a manner that when the bus voltage is varied, the feedback path gain is varied in a complementary fashion so that the overall loop gain remains constant. This allows the gain of the output stage, and consequently, the volume of the audio output to the loudspeaker, to be controlled independently of the loop gain.

A preamplification stage employing a distal attenuator may also be provided to increase the range of volume control which may be achieved using variable bus voltage alone.

It is therefore an object of the invention to provide a Class D amplifier employing a feedback loop in which volume control is provided by varying the bus voltage for the output stage.

It is a further object of the invention to provide such a Class D amplifier including a variable gain feedback path which compensates for the gain change produced by varying the bus voltage in a way that the overall loop gain remains constant, whereby the gain of the output stage can be controlled independently of the loop gain.

It is another object of the invention to provide Class D amplifiers having either half or full-bridge topology employing feedback loops for gain stabilization in which volume control is implemented by varying the bus voltage to the power output transistors.

BRIEF DESCRIPTION OF THE DRAWINGS

Other objects and features of the invention will become apparent from consideration of the following detailed description and the accompanying drawings, in which.

DETAILED DESCRIPTION OF THE INVENTION

Figure 1:
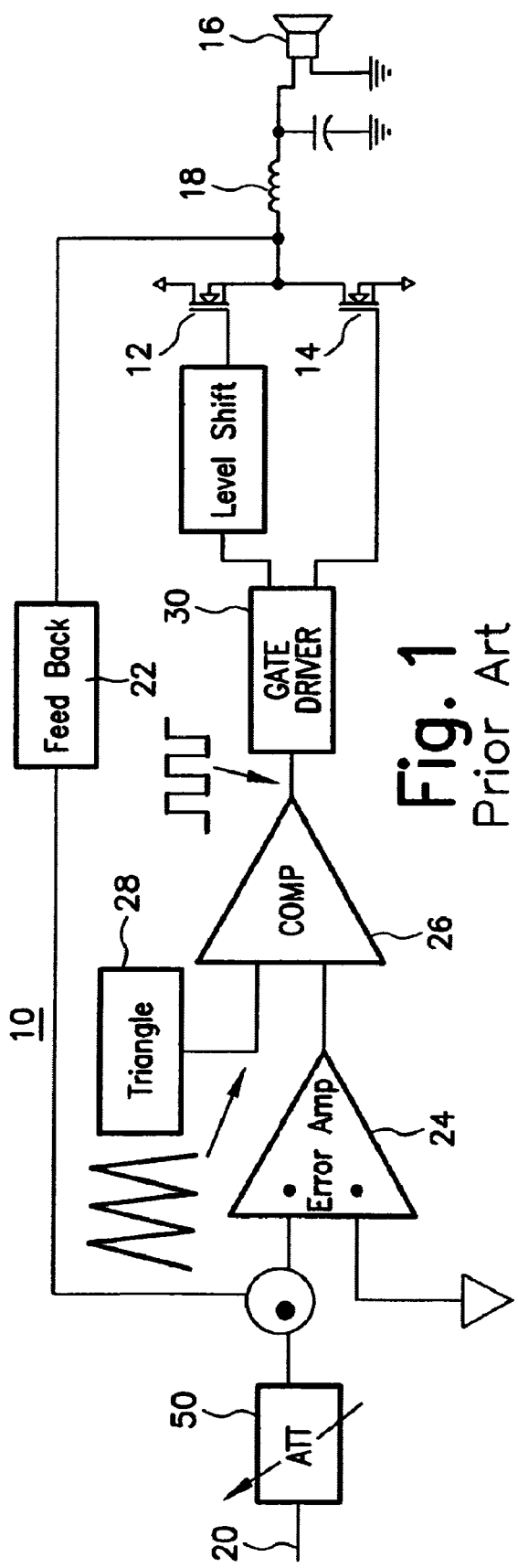
FIG. 1 shows a circuit diagram of a Class D amplifier having a conventional half bridge topology.
Figure 2:
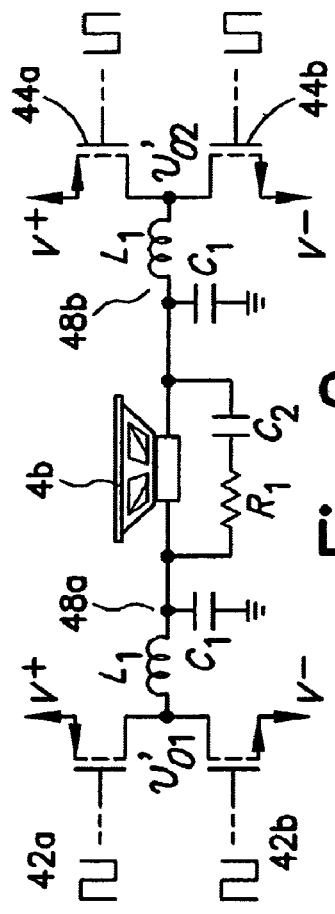
FIG. 2 shows a circuit diagram of the output stage of a Class D amplifier having a conventional H-bridge or full bridge topology.
Figure 3:
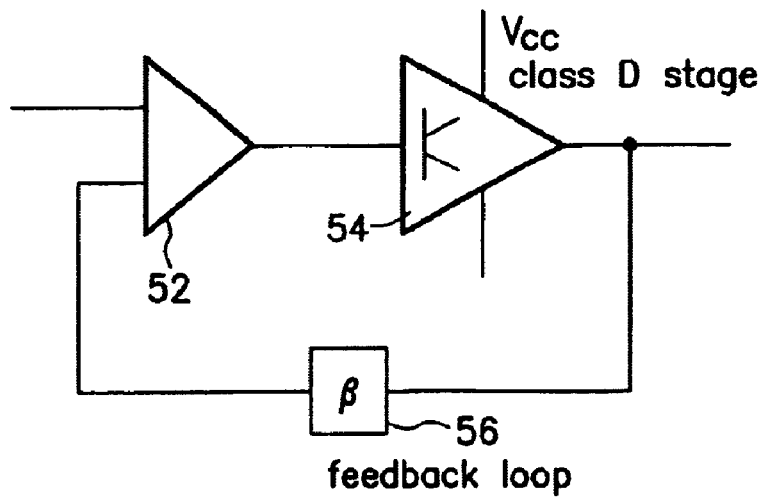
FIG. 3 shows a functional block diagram of a conventional Class D amplifier as shown in FIG. 1 having feedback stabilization which illustrates why variable bus voltage volume control can not be employed in such a configuration.
Figure 4:
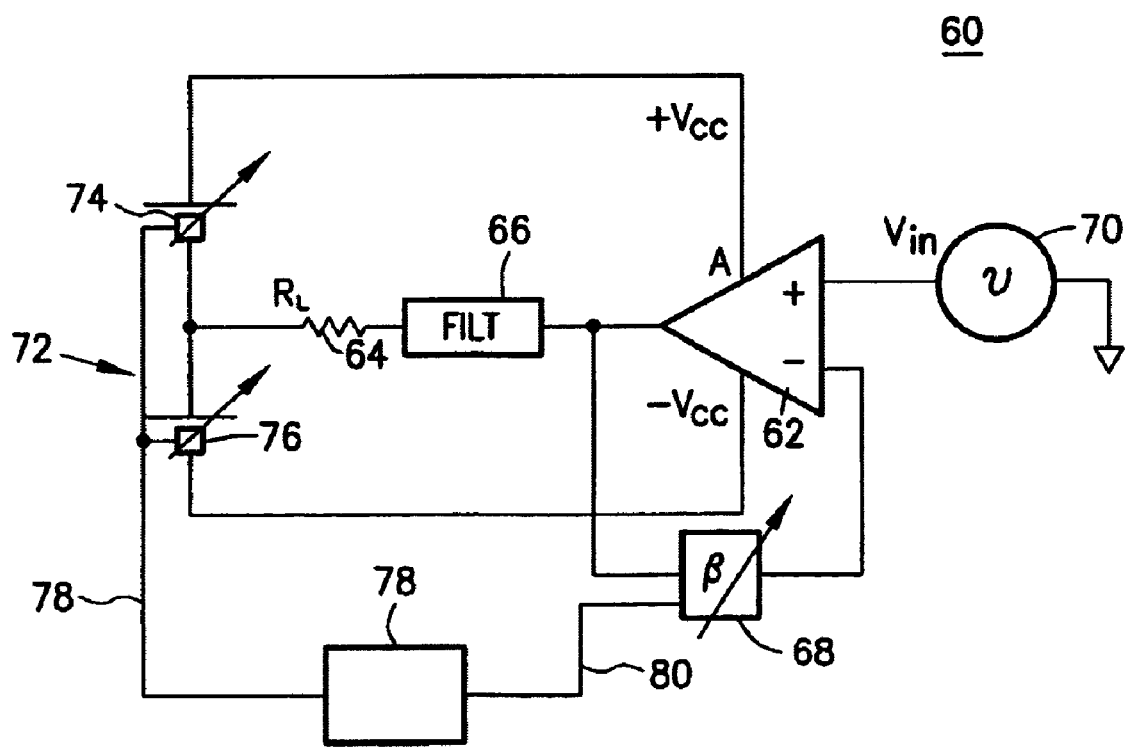
FIG. 4 shows a simplified circuit diagram of a Class D amplifier according to the invention which has feedback stabilization and variable bus voltage volume control.

Referring now to FIG. 4, a class D amplifier 60 includes an amplifier block 62 feeding a loudspeaker 64, shown as a load $R_L$ through a filter 66, and a feedback loop including a gain compensation element 68 having a variable gain β'. An audio signal corresponding to that provided at 20 in FIG. 1 is provided by signal source 70. From inspection, it will be appreciated that the topologies of FIGS. 1 and 4 are the same, with amplifier block 62 including all the elements of FIG. 1 except filter 18, load 16, and input 20.

As further illustrated in FIG. 4, there is provided a variable bus power supply subsystem 72 including a high side supply circuit 74 and a low side supply circuit 76, and a bus voltage control circuit 78 which cooperates with supply circuits 74 and 76 vary the bus voltages between equal and opposite minimum and maximum values to provide variable + and − bus voltage $V_{CC}$ for the output MOSFETS. Any suitable or desired implementation of the variable power supply subsystem 72 and the bus voltage controller 78 may be employed as such devices are well known to those skilled in this art.

Bus voltage controller 78 is also coupled, as indicated at 80, to control the gain of gain compensation element 68. The effective gain change for the output transistors in amplifier block 62 which results from the change in bus voltage introduced by controller 78 and the gain change effected in compensation element 68 are coordinated so that the overall loop gain remains unchanged, whereby the volume of the audio signal delivered to the loudspeaker can be adjusted by changing the amplifier bus voltage, independent of the loop gain.

Figure 5:
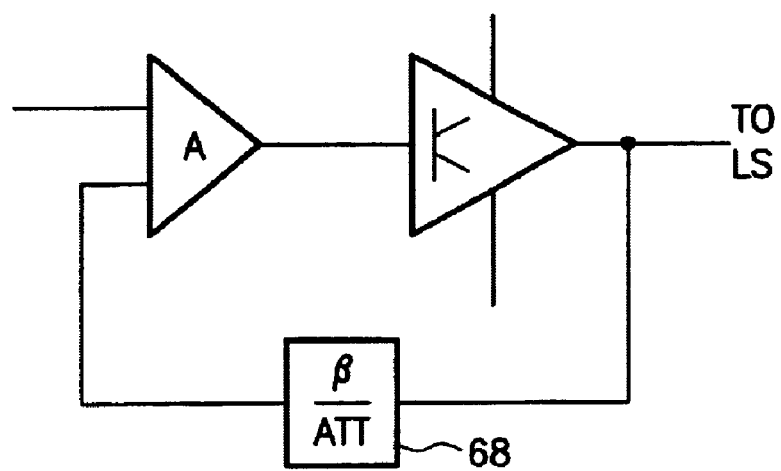
FIG. 5 is a functional block diagram of the circuit of FIG. 4 illustrating how variable bus voltage volume control is achieved.

Specifically, with reference to FIG. 5, assume that the maximum gain of the Class D output stage in amplifier A is equal to $KV_{CC}$, and that the volume of the audio signal to the loudspeaker (LS) is adjusted by introducing an attenuation factor α such that $K'=\alpha KV_{CC}$. To compensate for this, and to maintain the loop gain constant independent of α, controller 78 simultaneously changes the gain of compensation element 68 by a factor of 1/α. Thus, volume control by variation of the Class D stage bus voltage can be achieved in a closed loop system.

Figure 6:
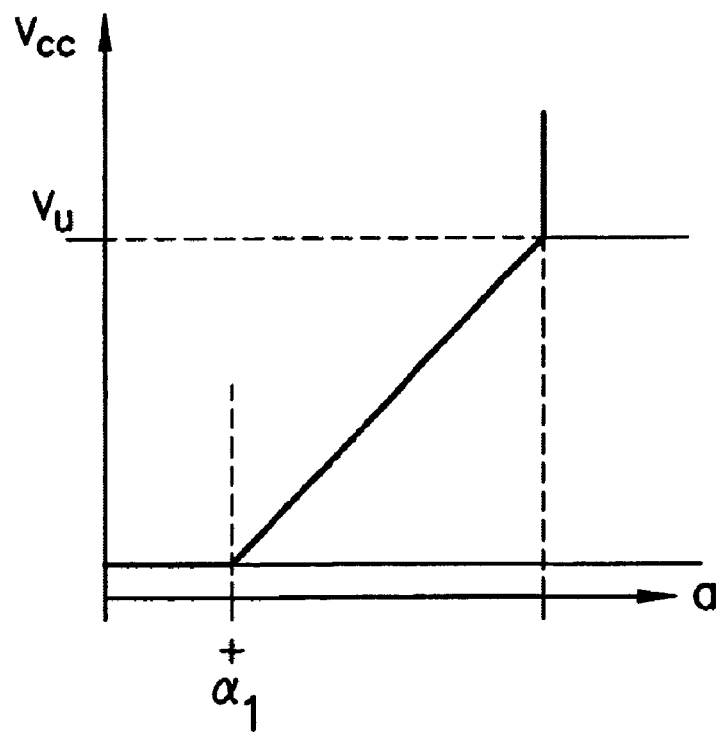
FIG. 6 shows how the variable bus voltage volume control according to the invention can be used in combination with a preconditioning stage providing digital attenuation to extend the range volume control.

While a wide range of gain adjustment can be achieved by variation of the bus voltage as described above, this may not be sufficient to provide practical volume control in certain instances. In such cases, it is possible employ a digital attenuator in a preconditioning stage ahead of the Class D amplifier. The effect of this is illustrated in FIG. 6 when the portion of the curve to the left of attenuation value $\alpha_1$ represents the effect of the digital attenuation.

Although the present invention has been described in relation to a particular embodiment thereof, many other variations and modifications and other uses will become apparent to those skilled in the art. It is intended, therefore, that the present invention is not be limited by the specific disclosure herein, but is to be given the full scope permitted by the appended claims.

I claim:

1. An audio amplifier comprising:
   two output transistors having respective current paths and control terminals,
   the current paths being connected in series between positive and negative power supply terminals with the common output node between the transistors being coupled to drive a loudspeaker;
   a driver circuit for the control terminals;
   a pulse width modulation (PWM) circuit which generates a pulse train, the duty cycle of which is representative of an input audio signal,
   the driver circuit being responsive to the pulse train to generate control terminal drive signals to drive the output transistors between substantially fully on and fully off states with one transistor being substantially fully on while the other is substantially fully off;
   a power supply which is operative to provide equal and opposite supply voltages respectively for the output transistors;
   a control circuit which is adjustable to vary the supply voltages between equal and opposite minimum and maximum absolute values; and
   a gain stabilization feedback loop including the PWM circuit, the output transistors, and a variable gain compensation element,
   the control circuit being further operative to vary the gain of the compensation element in coordination with the changes in the power supply voltage so that the overall loop gain is not affected by the changes in the power supply voltage, whereby the changes in the power supply voltage can be utilized to control the volume of the audio signal provided to the loudspeaker.

2. An amplifier according to claim 1, further including a digital attenuator for the incoming audio signal located ahead of the feedback loop.

3. An amplifier according to claim 1, wherein the control circuit is operative to introduce an attenuation factor α in the gain of the amplifier output stage by adjustment of the bus voltage, and an inverse factor 1/α in the gain of the compensation element.

* * * * *